United States Patent [19]

Arnosti et al.

[11] Patent Number: 4,977,984
[45] Date of Patent: Dec. 18, 1990

[54] APPARATUS AND METHOD FOR DETECTING ELEVATOR CAR POSITION IN A DOOR ZONE

[75] Inventors: Hansjörg Arnosti, Horw; Hans Bussmann, Ebikon, both of Switzerland

[73] Assignee: Inventio, Switzerland

[21] Appl. No.: 396,431

[22] Filed: Aug. 21, 1989

[30] Foreign Application Priority Data

Aug. 23, 1988 [CH] Switzerland ............... 3129/88

[51] Int. Cl.$^5$ .................................. B66B 1/50
[52] U.S. Cl. ..................................... 187/134
[58] Field of Search ............ 187/103, 104, 134, 113, 187/136; 340/512, 507, 686, 680

[56] References Cited

U.S. PATENT DOCUMENTS

| | | | |
|---|---|---|---|
| 3,636,543 | 1/1972 | Maecker | 340/680 |
| 3,743,056 | 7/1973 | Zitelli et al. | 187/134 |
| 4,362,224 | 12/1982 | Fairbrother | 187/134 |

FOREIGN PATENT DOCUMENTS 1809100 7/1970 Fed. Rep. of Germany.
2024637 8/1970 France.

Primary Examiner—A. D. Pellinen
Assistant Examiner—Charles E. Eckholdt
Attorney, Agent, or Firm—Marshall & Melhorn

[57] ABSTRACT

A method and apparatus for the generation of elevator car position information in an elevator shaft includes a safety light barrier mounted on the car and actuating vanes in the shaft cooperating with a safety circuit for connecting the door and lock contacts to a source of electrical power in the door zone of a destination floor for a stopping elevator car. The safety light barrier has two transmitters and two receivers which are positioned on a horizontal line and are masked simultaneously by the actuating vanes. The safety circuit includes two redundant systems for signal preparation and signal evaluation including test circuits to recognize errors and prevent a premature opening of the elevator door.

15 Claims, 2 Drawing Sheets

APPARATUS AND METHOD FOR DETECTING ELEVATOR CAR POSITION IN A DOOR ZONE

BACKGROUND OF THE INVENTION

The present invention relates generally to a method and an apparatus for the generation of elevator car position information and, in particular, to the formation of signals for actuating the door mechanisms of a stopping elevator car.

The prevention of a premature initiation of the door opening during the leveling operation of an elevator car into a destination floor places high technological demands on the devices and circuits which bridge or enable the door and lock contacts at the stop within a door zone during the leveling operation. There exist safety regulation provisions and standards which prescribe and recommend the principle of operation and the main functions of such devices and circuits. Assemblies of such devices and circuit, which comply with these respective safety regulations, are known by the term "fail-safe" assembly.

Such an assembly is described as a fail-safe detector in U.S. Pat. 3,743,056. The detector shown in this patent is a photoelectric reflective system. Appropriately positioned reflective plates or vanes in the elevator shaft reflect a pulsed infrared signal to a light receiver such as a phototransistor which generates a pulsed output signal which is tested for its authenticity by comparison of its amplitude with a reference value. The light receiver output signal must correspond in frequency to the light emitter signal whereby outside light reflections become ineffective. Furthermore, the circuit components are chosen and designed in such a manner, that the breakdown of individual or several components would not result in any safety endangering switching function.

The above described device has the disadvantages of the lack of a backup or auxiliary circuit in the case of a failure and that the various switching circuits are arranged in a decentralized manner.

SUMMARY OF THE INVENTION

The present invention solves the problem of the prior art devices by providing a method and a device which includes a backup circuit, complies with all building regulations and specifications and is compact in the arrangement of its functional circuits. The advantages of the present invention are that the compact arrangement of the functional circuits requires only a single apparatus housing which eliminates all external intermediate connections, that the device is simpler in its operation and cheaper in its manufacture and assembly than prior art devices, and that through internal test circuits failures are recognized prior to their effect and are rendered harmless.

A safety light barrier mounted on an elevator car cooperates with actuating vanes positioned at the floors along the elevator shaft A safety circuit has two pairs of photoelectric transmitters and receivers mounted on the safety light barrier. Each paired transmitter and receiver is driven by a pulse generator. The receiver emits a detection signal which is compared with the pulse generator signal for the purpose of generating a first error signal should there be a frequency difference. The output signals from both comparisons are tested in a function testing circuit for interference and a second error signal is generated if any interference is detected. Either the first error signal or the second error signal is effective to disconnect an enable signal from the safety circuit and prevent the elevator door from opening.

A pair of door relays have contacts connected in series with the door and lock contacts of the door operating mechanism. Each one of the door relays is actuated by the output signal from an associated one of the comparisons and when both relays are actuated, the door and lock contacts are connected to a source of electrical power to enable the door to open. The safety circuit tests for the presence of both comparison signals within a predetermined period of time to permit the second relay to be actuated.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
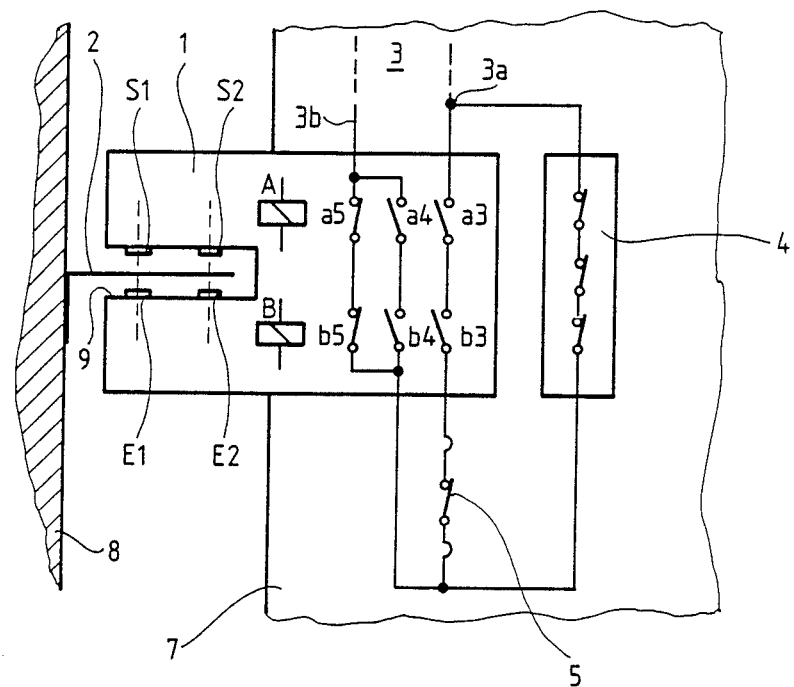
FIG. 1 is a schematic top plan view of a door zone position detection apparatus for an elevator car in accordance with the present invention.

In FIG. 1, a position detection apparatus is shown including a safety light barrier 1 with a cooperating actuating vane 2 and a safety circuit 3. S1 is a first transmitter means, S2 is a second transmitter means, E1 is a first receiver means and E2 is a second means receiver all mounted on the barrier 1. The safety circuit 3 has a pair of electrical power leads between which are connected a plurality of contacts. A door safety relay "A" having contacts a3, a4 and a5 and a door safety relay "B" having contacts b3, b4 and b5 form a portion of the safety circuit 3. The normally open contacts a3 and b3, a normally closed motor contactor contact 5, and the normally open contacts a4 and b4 are connected in series between a first power lead 3a and a second power lead 3b. The series-connected set of contacts a3, b3 and 5 is connected in parallel with a series-connected plurality of normally closed door and lock contacts 4. The series connected contacts a4 and b4 are connected in parallel with series connected normally closed contacts a5 and b5.

Figure 2:
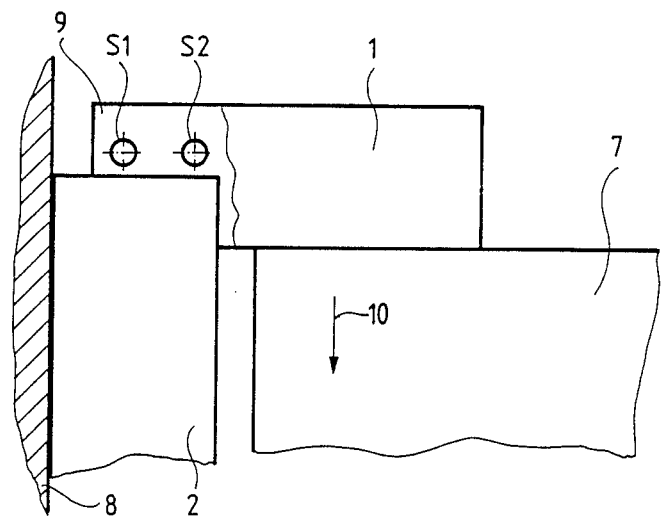
FIG. 2 is a schematic fragmentary front elevational view of the position detection apparatus of FIG. 1.

The barrier 1 is shown in FIG. 2 mounted on top of an elevator car 7 with a portion of the barrier cut away to reveal how the actuating vane 2 attached to an elevator shaft wall 8 extends into a groove 9 formed in the safety light barrier 1. With a downwardly traveling elevator car 7, as signified by an arrow 10, an upper edge of the actuating vane 2 extends from below into the groove 9 in the safety light barrier 1 as shown. As the car 7 continues its downward travel, the upper horizontal edge of the actuating vane 2 covers the two transmitters S1 and S2 typically positioned on a generally horizontal line. The vane 2 is formed of a light opaque material and interrupts, essentially simultaneously, the light rays directed by the transmitters toward the receivers E1 and E2 (not shown).

Figure 3:
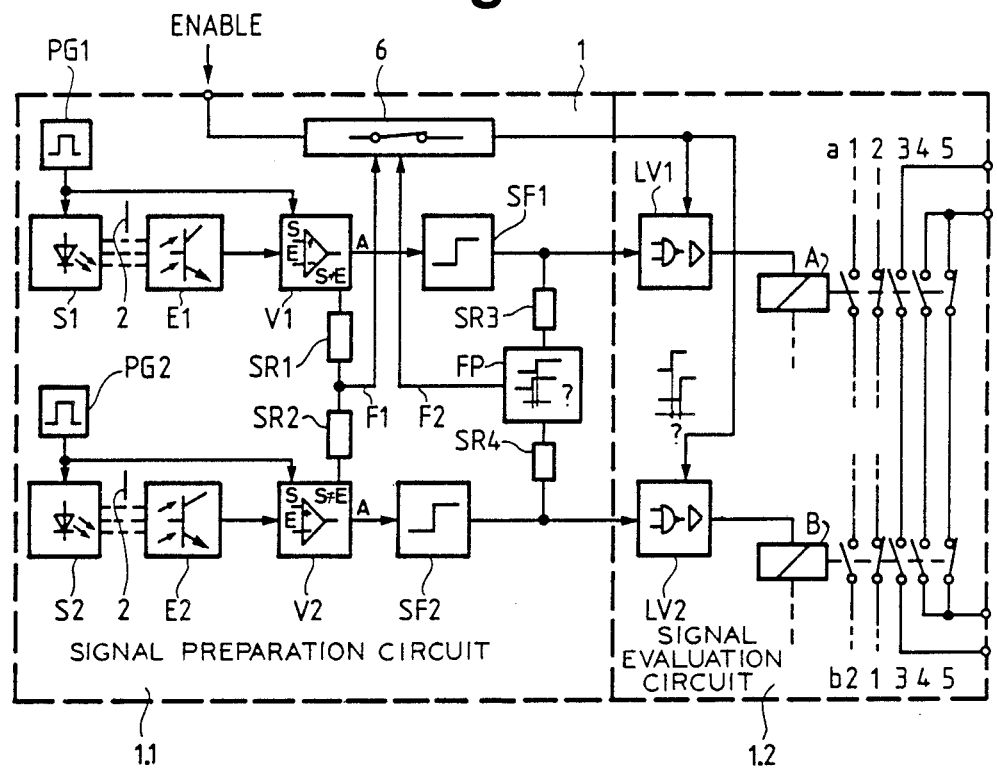
FIG. 3 is a block diagram of the safety circuit of the position detection apparatus of FIG. 1.

In FIG. 3, the functions of the safety light barrier 1 and safety circuit are subdivided into two main circuit groups, a signal preparation circuit 1.1 and a signal evaluation circuit 1.2. In the circuit 1.1, the transmitter S1 is fed by a square wave pulse generator PG1 and the transmitter S2 is fed by a similar pulse generator PG2. The transmitter S1 and receiver E1 typically are photo-electric devices which generate and detect respectively pulses of light and cooperate to generate a detection signal at the pulse frequency of the generator PG1 at an output of the receiver E1 connected to an inverting input E of a comparator V1. The pulse generator output is also applied as a reference signal to a non-inverting input S of the comparator V1. A similar comparator V2 receives the output reference signal from the pulse generator PG2 and the detection signal from the receiver E2 at inputs S and E respectively.

In the case of frequency differences between the signals at the S and the E inputs, the associated comparator means generates an output S≠E as a first error signal F1 which signal is supplied to a first input of an ENABLE interrupter 6. In order to functionally separate the two comparator outputs S≠E, outputs of V1 and V2 are connected to the interrupter input through high resistance safety resistors SR1 and SR2 respectively Upon the complete absence or loss of the receiver signal at the inputs E, the comparators V1 and V2 generate a signal at their outputs A which outputs are connected to an input of signal shapers SF1 and SF2 respectively. The output signals from the signal shapers SF1 and SF2 are connected through high resistance resistors SR3 and SR4 respectively to inputs to a common function testing circuit FP, where the signals are checked for freedom from interference. In the case of the detection of a disturbance or interference, the circuit FP generates a second error signal F2 at an output which is connected to a second input of the ENABLE interrupter 6. Thus, the function readiness and associated function of the signal preparation circuit 1.1 is statically tested at every position of the elevator car as it travels along the elevator shaft.

The functional circuit 1.2 includes two logic and amplifier circuits LV1 and LV2 and the door safety relays "A" and "B" with their internal contacts a1 and a2 and b1 and b2 respectively. The contacts a3, a4 and a5 as well as b3, b4 and b5 are shown as connected in FIG. 1. The outputs of the signal shapers SF1 and SF2 are connected to inputs of the circuits LV1 and LV2 respectively. Outputs of the circuits LV1 and LV2 are connected to actuating inputs of the relays "A" and "B" respectively. The logic and amplifier circuits also have enable inputs which are connected through the interrupter 6 to a source of an ENABLE signal. Signal steps displaced in time with a question mark are shown in the function testing circuit block FP and between the logic and amplifier circuit blocks LV1 and LV2 to indicate a coincidence test taking place in the signal evaluation circuit 1.2. The contacts a1, a2, b1 and b2 are part of an internal locking logic which is explained in connection with FIG. 4.

Figure 4:
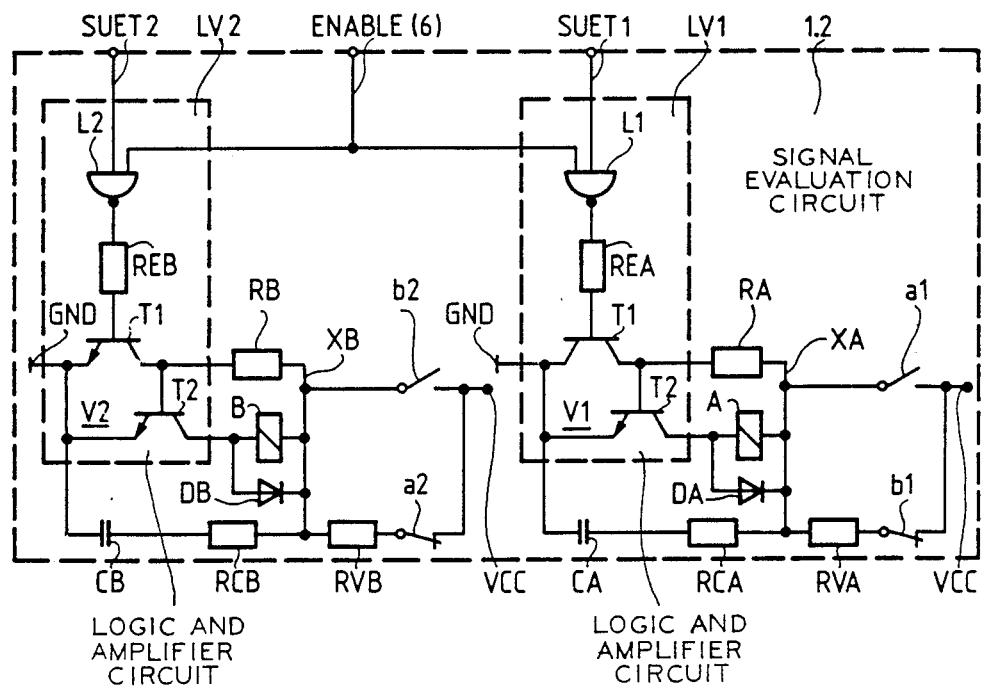
FIG. 4 is a schematic circuit diagram of the signal evaluation portion of the circuit of FIG. 3.

Details of the signal evaluation circuit 1.2 can be seen in FIG. 4. A pair of NAND gates L1 and L2 each have two inputs, a common ENABLE input connected to the source of the ENABLE signal through the ENABLE interrupter 6 and a signal input for signals SUET1 and SUET2 respectively, which are generated at the outputs of the corresponding signal shapers SF1 and SF2. The outputs of the NAND gates L1 and L2 are connected through input resistors REA and REB respectively to a base of a first transistor T1 in corresponding amplifiers V1' and V2'. Each amplifier V1' and V2' also includes a second transistor T2 having a base connected to a collector of the transistor T1 and an emitter connected to an emitter of the transistor T1 to form a two stage amplifier.

The transistors T2 each have a collector connected to one end of a contact actuating coil of the corresponding door safety relays "A" and "B" and the emitters are connected to the circuit zero or ground potential GND. Thus, when the transistors T1 and T2 are in the conducting state, the associated one end of the door safety relay contact actuating coil is connected with the GND potential. The other end of each actuating coil of the relays "A" and "B" is connected to a line or a node XA and XB respectively. A resistor RA and a resistor RB are connected between the collector of the transistor T1 and the respective lines XA and XB. A diode DA and a diode DB each have an anode connected to the collector of the associated transistor T2 and a cathode connected to the respective line XA and XB. A capacitor CA and a capacitor CB each is connected at one side to the GND potential and at the other side through resistors RCA and RCB respectively to the respective line XA and XB. The lines XA and XB are connected through resistors RVA and RVB in series with normally closed contacts b1 and a2 respectively to a source of positive potential VCC. Tee lines XA and XB are also connected with the potential VCC through the normally open contacts a1 and b2 respectively.

The position detector apparatus described in the preceding operates in the following manner: If the elevator car 7 is traveling in a downward direction it will pass floors without a car call and without a floor call assigned thereto. While passing such floors, the safety light barrier 1 will be interrupted by the actuating vane 2 which marks the door zone at, for instance, twenty cm above the door level. The actuating vane 2, starting with its horizontal upper edge, covers practically simultaneously the two transmitters S1 and S2 located on a horizontal line and the receivers E1 and E2 cannot receive the transmitter signals to generate an indication of the detection thereof.

In case the two comparators V1 and V2 have not previously detected a frequency error between the inputs S and E prior to the entrance of the actuating vane 2 into the groove 9 in the safety light barrier 1, the two comparators will now detect the practically simultaneous removal or absence of the receiver frequency detection signal at each input E. This change of the input signal to the comparators V1 and V2 is inverted in the following signal shaping circuits SF1 respectively SF2 and processed into a positive signal step. The output signals of the signal shapers SF1 and SF2 are each conducted by way of the high resistance safety resistors SR3 and SR4 respectively to the function test block FP. The redundancy inherent in the separate circuits remains assured since the high resistance safety resistors SR3 and SR4, as well as the circuits SR1 and SR2, prevent a cross connection or coupling of the signals generated by the comparators V1 and V2.

The function testing circuit FP monitors and checks for the presence and simultaneity of the signals from the signal shapers SF1 and SF2 as the elevator car passes a floor. In the case of a detected fault, the second error signal F2 is continuously generated, which causes the contact in the interrupter 6 to open and block the EN- ABLE signal generated for the floor being passed. The error signal F2 can only be reset manually. The error signal F1 can be generated by one individual comparator V1 or V2, or by both the comparators V1 and V2 together. Thus, the signal preparation circuit 1.1 dynamically tests the function readiness and function on passing unserviced floors and on leveling in at a destination floor.

The error signal F1, generated in response to frequency deviations between the inputs E and S, likewise can only be reset manually after its cause has been eliminated. A resetting of the error signals F1 or F2 usually is accomplished by switching on or off the supply voltage which is the same potential for the entire system. The voltage source as well as the corresponding error memory and resetting circuit are not illustrated. When arriving at a floor of destination and leveling in at the door zone the two signals from the signal shapers SF1 and SF2 are only transferred as shaped signals SUET1 and SUET2 to the input resistors REA and REB respectively by way of the NAND gates L1 and L2 respectively, if the ENABLE signal is present and not blocked by the interrupter 6. In the case of a missing ENABLE signal the logic and amplifier circuits LV1 and LV2 cannot respond to the SUET1 and SUET2 shaped signals and the elevator door is only opened at standstill at the floor level.

In the normal operation, the two NAND gates L1 and L2 are unblocked promptly with the ENABLE signal prior to the leveling in at the door zone of the destination stop. Now when the actuating vane 2 enters the safety light barrier 1, the SUET1 and SUET2 signals can pass the two NAND gates and control the respective amplifiers $\underline{V1}$ and $\underline{V2}$ by switching each of the transistors T1 and T2 by way of the respective input resistors REA and REB. In the state of quiescence, the two capacitors CA and CB are each charged approximately to the supply voltage VCC level. The charging takes place through the resistors RCA and RVA and the closed contact b1 for the capacitor CA and by way of the resistors RCB and RVB and the closed contact a2 for the capacitor CB. Furthermore, the transistors T1 are conducting and the transistors T2 are turned off in the quiescent state. The resistance values of the associated resistors RCA. RVA and RA and the associated resistors RCB. RVB and RB have a ratio to each other of, for example, one to ten to two hundred. Considering the voltage division between the resistors RVA and RA, and between the resistors RVB and RB, the voltage drop through the transistors T1, and the leakage current flowing parallel to the charging current through resistor RA and associated transistor T1, and through resistor RB and associated transistor T1 respectively, the fully charged capacitor voltage is about 95% VCC.

Upon opening of the contacts b1 or a2 due to actuation of the coils of the relays "A" and "B" respectively, the capacitor CA discharges by way of the resistors RCA and RA and the transistor T1 and the capacitor CB discharges by way of the resistors RCB and RB and the transistor T1, each discharge with the corresponding time constant determined by the resistance and capacitance values. When the actuating vane 2, during leveling in at the door zone, moves in front of the transmitters S1 and S2, their masking does not take place at exactly the same instant due to mechanical tolerances such that synchronism is not absolute. Furthermore, the signal transit times up to and during the actuation of the corresponding door safety relays "A" or "B", as determined by the electrical tolerances, are not necessarily of equal length. From this it follows that one of the door safety relays "A" and "B" will actuate or "pull in" first.

The first door safety relay to pull in opens its contact b1 or a2 and disconnects the circuit of the other or second relay from the positive potential VCC. The capacitor CA or CB associated with the disconnected second relay begins its discharge and induces self-holding or latching of its associated contact a1 or b2. The second door safety relay now has to be controlled within, for example, the first half of the associated discharge time constant in order to be able to pull in. This time interval is defined as test time and this process is the function of the simultaneity check. If the two detection signals do not arrive within a predetermined time interval both door safety relays cannot pull in. If the car door is released upon leveling in at the floor and only a single door safety relay "A" or "B" is pulled in, then, due to an open contact in series with the door and lock contacts 4, the safety circuit itself is opened, which results in an emergency stop of the elevator in the proximity of the floor level. This emergency stop can be avoided if one each, not illustrated closing contact of the door safety relays "A" and "B", connected in series, gives the elevator control a readiness signal for opening the door, and in the case of failure releases the door opening only at standstill of the elevator by way of the elevator control.

If, for example, a contact of one door safety relay welds together, the second door safety relay can no longer pull in the next time because the welded together relay remains mechanically in the pulled in condition and thus, with its inoperative contact b1 or a2 keeps the charging current circuit open for the capacitor of the second door safety relay. In this way, the corresponding capacitor remains safely discharged and a pulling in of the second door safety relay at the next destination stop is not possible, which results in the earlier described consequences.

In a further embodiment of the present invention, it is possible to incorporate additional parallelly and independently operating photoelectric detection systems in the same safety light barrier 1. These additional detection systems would deliver separate signals for further purposes to the elevator control. The additional detection systems sensors can also be arranged vertically, such that when combined with appropriately positioned openings in the actuating vanes 2, they would serve additionally as releveling detectors.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A method for generating elevator car position information in an elevator shaft for connecting a plurality of door and lock contacts to a source of electrical power when the elevator car is in a door zone of a destination floor for stopping the elevator car, comprising the steps of:

a. providing an elevator car with a safety light barrier connected to a safety circuit, said safety circuit having a signal preparation circuit and a signal evaluation circuit including a pair of door safety relays, each said relay having a plurality of contacts actuated by the energization of an associated relay coil and connected in series with a plurality of door and lock contacts;

b. testing a function readiness and an associated function of said signal preparation circuit statically at every position of the elevator car in an associated elevator shaft and dynamically on passing of unserviced floors and on leveling in at a floor of destination by the elevator car, and upon sensing errors during said testing, generating at least two different error signals representing an error in the function readiness and an error in the associated function; and c. performing a simultaneity check in said signal evaluation circuit of shaped signals applied to inputs of said signal evaluation circuit by said signal preparation circuit on leveling in at a destination floor by starting a testing time upon a pull in of one of said door safety relays and preventing the other one of said door safety relays from pulling in after the expiration of the testing time whereby a premature opening of the elevator door is prevented.

2. The method according to claim 1 wherein said signal preparation circuit includes a pair of pulse generators each connected to an associated transmitter with an associated receiver for generating a pair of pulsed detection signals and wherein said step b. for the testing of the function readiness includes comparing the pulse frequency of each said detection signal with the pulse frequency of the associated pulse generator and generating a first one of said error signals in response to a frequency difference and not generating said first error signal upon the simultaneous omission of both said detector signals to indicate a detection of an actuating vane in the elevator shaft.

3. The method according to claim 1 including applying said shaped signals to a function testing circuit, checking said shaped signals for interference, and generating a second one of said error signals in response to the detection of interference.

4. The method according to claim 1 including activating an ENABLE interrupter to disconnect said signal evaluation circuit from a source of an ENABLE signal in response to either one of said error signals.

5. The method according to claim 4 wherein said signal preparation circuit includes a pair of pulse generators each connected to an associated transmitter with an associated receiver for generating a pair of pulsed detection signals and wherein said step b. for the testing of the function readiness includes comparing the pulse frequency of each said detection signal with the pulse frequency of the associated pulse generator and generating a first one of said error signals in response to a frequency difference and not generating said first error signal upon the simultaneous omission of both said detector signals to indicate a detection of an actuating vane in the elevator shaft.

6. The method according to claim 4 including applying said shaped signals to a function testing circuit, checking said shaped signals for interference, and generating a second one of said error signals in response to the detection of interference.

7. An apparatus for detecting elevator car position in a door zone of a destination floor for stopping the elevator car, comprising:

a safety light barrier adapted to be positioned on an elevator car and connected to a safety circuit having a signal preparation circuit and a signal evaluation circuit including a pair of door safety relays, each said relay having a plurality of contacts actuated by the energization of an associated relay coil and connected in series with a plurality of door and lock contacts;

comparator means in said signal preparation circuit for testing a function readiness and an associated function of said signal preparation circuit statically at every position of the elevator car in an associated elevator shaft and dynamically on passing of unserviced floors and on leveling in at a floor of destination by the elevator car and for generating error signals upon sensing errors in the function readiness and the associated function; and said signal preparation circuit generating a pair of shaped signals and said signal evaluation circuit including means responsive to said shaped signals for performing a simultaneity check on leveling in of the elevator car at a destination floor including starting a testing time upon receipt of one of said shaped signals and preventing premature opening of the elevator door after the expiration of the testing time without receipt of the other one of said shaped signals.

8. The apparatus according to claim 7 wherein said safety light barrier includes at least two separate, parallelly working photoelectric detection systems connected in said signal preparation circuit to said comparator means.

9. The apparatus according to claim 7 wherein said signal evaluation circuit includes means for latching said door safety relays in response to said shaped signals.

10. The apparatus according to claim 7 wherein said signal preparation circuit includes an enable interrupter connected between a source of an enable signal and said signal evaluation circuit and responsive to said error signals for disconnecting the enable signal from said signal evaluation circuit.

11. An apparatus for detecting elevator car position in a door zone comprising:

a signal preparation circuit including a pair of signal pulse generators for generating pulsed output signals, and a pair of transmitters and associated receivers each connected to one of said generators for generating a detection signal, said signal preparation circuit generating shaped signals in response to said detection signals; and a signal evaluation circuit including a pair of door safety relays, each said relay having at least one normally open contact adapted to be connected in series with a plurality of door and lock contacts for opening an elevator door, and a pair of logic and amplifier circuits each connected to an associated one of said relays and responsive to an associated one of said shaped signals for actuating said associated relay and closing said normally open contact 12. The apparatus according to claim 11 including an enable interrupter connected between a source of an enable signal and said signal evaluation circuit.

13. The apparatus according to claim 12 including a pair of comparators, each said comparator having one input connected to an associated one of said generators and another input connected to an associated one of said receivers for generating a first error signal upon detecting a frequency difference between said associated one generator output signal and said associated one receiver detection signal, and wherein said enable interrupter is responsive to said first error signal for disconnecting said signal evaluation circuit from enable signal source.

14. The apparatus according to claim 13 including a pair of signal shapers, each said signal shaper connected to an associated one of said comparators for generating one of said shaped signals, and a function testing circuit connected to said signal shapers and responsive to an interference with either of said shaped signals for generating a second error signal, said enable interrupter being responsive to said second error signal for disconnecting said signal evaluation circuit from said enable signal.

15. The apparatus according to claim 11 wherein a first one of said logic and amplifier circuits to receive said associated one shaped signal starts a testing time and wherein a second one of said logic and amplifier circuits to receive said associated one shaped signal is enabled by said first one logic and amplifier circuit to actuate its associated relay prior to the expiration of said testing time and is disabled from actuated its associated relay subsequent to the expiration of said testing time.

* * * * *